United States Patent
Ishikawa (10) Patent No.: US 9,426,881 B2
(45) Date of Patent: Aug. 23, 2016

(54) PRINT CIRCUIT BOARD AND ELECTRONIC DEVICE USING THE SAME

(75) Inventor: Koji Ishikawa, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 108 days.

(21) Appl. No.: 12/516,983

(22) PCT Filed: Jun. 27, 2008

(86) PCT No.: PCT/JP2008/062116
§ 371 (c)(1),
(2), (4) Date: May 29, 2009

(87) PCT Pub. No.: WO2009/013988
PCT Pub. Date: Jan. 29, 2009

(65) Prior Publication Data
US 2010/0126760 A1    May 27, 2010

(30) Foreign Application Priority Data
Jul. 25, 2007    (JP) .................................. 2007-192906

(51) Int. Cl.
*H05K 1/02* (2006.01)
*H04N 5/225* (2006.01)
*H05K 1/18* (2006.01)
*H05K 3/46* (2006.01)

(52) U.S. Cl.
CPC ........... *H05K 1/0218* (2013.01); *H04N 5/2253* (2013.01); *H05K 1/0219* (2013.01); *H05K 1/0237* (2013.01); *H05K 1/0298* (2013.01); *H05K 1/189* (2013.01); *H05K 3/4611* (2013.01); *H05K 2201/0715* (2013.01); *H05K 2201/09072* (2013.01); *H05K 2201/09236* (2013.01); *H05K 2201/09336* (2013.01); *H05K 2201/10121* (2013.01); *H05K 2201/10189* (2013.01)

(58) Field of Classification Search
None
See application file for complete search history.

(56) References Cited

U.S. PATENT DOCUMENTS

| 5,475,606 | A | * | 12/1995 | Muyshondt et al. | 174/257 |
| 5,797,837 | A | * | 8/1998 | Minami | 600/109 |
| 6,932,623 | B2 | * | 8/2005 | Lai | 439/76.1 |
| 7,502,021 | B2 | * | 3/2009 | Choi et al. | 345/211 |
| 2003/0025824 | A1 | | 2/2003 | Ishikawa | |
| 2004/0233319 | A1 | * | 11/2004 | You et al. | 348/340 |
| 2007/0025710 | A1 | * | 2/2007 | Shin et al. | 396/55 |
| 2007/0173084 | A1 | * | 7/2007 | Wang | 439/77 |

FOREIGN PATENT DOCUMENTS

| JP | 05-299878 A | 11/1993 |
| JP | 06-274246 A | 9/1994 |
| JP | 07-170029 A | 7/1995 |
| JP | 09-298626 A | 11/1997 |
| JP | 10-313178 A | 11/1998 |
| JP | 11-040906 A | 2/1999 |
| JP | 11-163539 A | 6/1999 |
| JP | 11-261904 A | 9/1999 |
| JP | 2002-176231 A | 6/2002 |
| JP | 2006-115160 A | 4/2006 |
| JP | 2006-121151 A | 5/2006 |
| JP | 2006-203547 A | 8/2006 |
| WO | 2006/033346 A | 3/2006 |

OTHER PUBLICATIONS

The above references were cited in a Apr. 17, 2012 Japanese Office Action, which is enclosed without English Translation, that issued in Japanese Patent Application No. 2007-192906.

\* cited by examiner

*Primary Examiner* — Dion R Ferguson
(74) *Attorney, Agent, or Firm* — Cowan, Liebowitz & Latman, P.C.

(57) ABSTRACT

A print circuit board includes a first layer on which a land is formed, a second layer on which an analog signal pattern and a first ground pattern are wired, a third layer on which a digital signal pattern and a second ground pattern are wired, and a fourth layer on which a third ground pattern is wired. The digital signal pattern is vertically sandwiched between the first ground pattern and the third ground pattern. The analog signal pattern and digital signal pattern are arranged without overlapping each other on the projection plane. The analog signal pattern and second ground pattern are arranged so as to overlap each other.

5 Claims, 8 Drawing Sheets

… CLOSE…

PRINT CIRCUIT BOARD AND ELECTRONIC DEVICE USING THE SAME

TECHNICAL FIELD

The present invention relates to a print circuit board and, more particularly, to a flexible print circuit board having a multilayer structure and an electronic device using the flexible print circuit board.

BACKGROUND ART

As the number of pixels of a photoelectric conversion element increases, a demand has arisen for aligning the light receiving surface of a photoelectric conversion element with respect to the image plane of an image sensing lens optical system at higher precision. To meet this demand, an image capturing apparatus needs to have a mechanism capable of adjusting the position (plane tilt) of a photoelectric conversion element with respect to the lens barrel.

The image capturing apparatus comprises a photoelectric conversion element, a driving circuit for driving it, and a signal processing circuit for processing a signal output from the photoelectric conversion element. The photoelectric conversion element needs to be electrically connected to a print circuit board on which the signal processing circuit and driving circuit are mounted.

As described above, the plane tilt of the photoelectric conversion element must be adjusted. Thus, the print circuit board which is attached to the image capturing apparatus main body and supports the signal processing circuit and driving circuit, and the photoelectric conversion element connected to the print circuit board need to be relatively movable.

For this purpose, according to the invention disclosed in Japanese Patent Laid-Open No. 11-261904, a photoelectric conversion element, and a print circuit board on which a signal processing circuit and driving circuit for the photoelectric conversion element are mounted, are connected by a flexible print circuit board. A position regulation member is arranged to regulate the position of a photoelectric conversion element package along the optical axis of a lens barrel. The position regulation member and the photoelectric conversion element package mounted on the flexible print circuit board are fixed. By finely adjusting the relative positions of the lens barrel and position regulation member along the optical axis, the light receiving surface of the photoelectric conversion element can be aligned at high precision with respect to the image plane of the image sensing lens optical system.

In the prior art, the photoelectric conversion element package is mounted on the flexible print circuit board, and the flexible print circuit board is extended and directly connected to the print circuit board on which the signal processing circuit and driving circuit are mounted. By using the flexible print circuit board for the connection, the photoelectric conversion element, and the print circuit board on which the signal processing circuit and driving circuit are mounted, are electrically connected to each other while they are relatively movable.

The interconnection from the photoelectric conversion element to the print circuit board on which the signal processing circuit and driving circuit are mounted, includes the signal output pattern of the photoelectric conversion element, and a driving pulse pattern for driving the photoelectric conversion element. The signal output pattern of the photoelectric conversion element is vulnerable to mixing of noise, and crosstalk from the driving pulse pattern must be prevented.

Along with recent increases in the number of pixels of a photoelectric conversion element and the number of functions, the driving clock rate is increasing. An increase in unwanted radiation from the driving pulse pattern owing to the increase in driving clock rate must also be prevented.

To meet these requirements, according to the invention disclosed in Japanese Patent Laid-Open No. 9-298626, a slit is formed between the driving pulse pattern and signal output pattern of the flexible print circuit board on which the photoelectric conversion element is mounted. With this slit, the signal output pattern and driving signal pulse pattern are formed spatially apart from each other.

According to the invention disclosed in Japanese Patent Laid-Open No. 10-313178, a power supply layer and ground layer are arranged on inner layers. A driving pulse pattern and signal output pattern are arranged separately on two external layers so that they do not overlap each other when viewed from the top. This arrangement prevents interference of the driving pulse pattern with the signal output pattern.

DISCLOSURE OF INVENTION

An aspect of the present invention is a print circuit board comprising a first layer on which a land is formed, a second layer on which an analog signal pattern and a first ground pattern are wired, a third layer on which a digital signal pattern and a second ground pattern are wired, and a fourth layer on which a third ground pattern is wired. The digital signal pattern is vertically sandwiched between the first ground pattern and the third ground pattern. The analog signal pattern and digital signal pattern are arranged without overlapping each other on the projection plane. The analog signal pattern and second ground pattern are so arranged as to overlap each other.

Further features of the present invention will become apparent from the following description of exemplary embodiments (with reference to the attached drawings).

BEST MODE FOR CARRYING OUT THE INVENTION

An embodiment of the present invention will be described with reference to the accompanying drawings.

Figure 1:
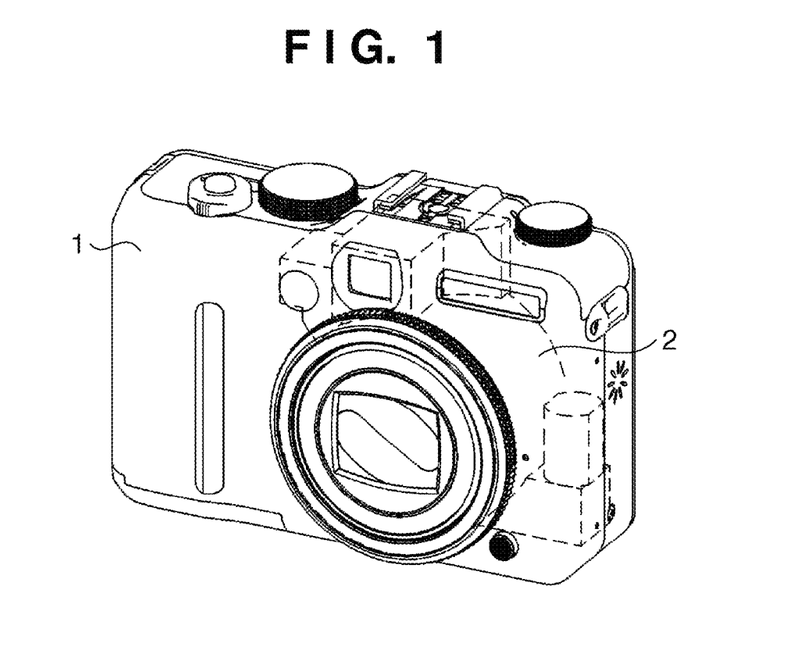
FIG. 1 is an outer perspective view of an image capturing apparatus (digital camera) according to an embodiment of the present invention when viewed from the front.
Figure 2:
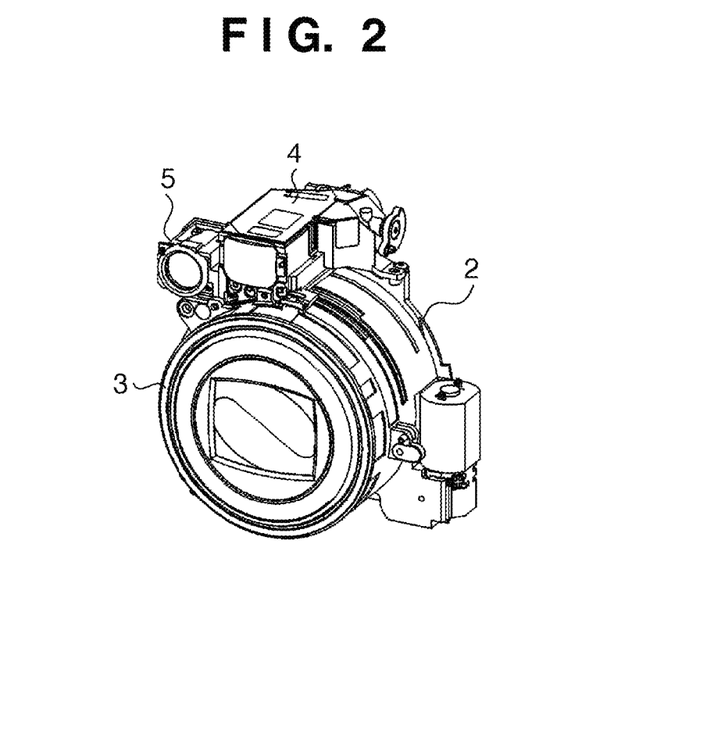
FIG. 2 is an outer perspective view showing an image capturing unit according to the embodiment of the present invention.
Figure 3:
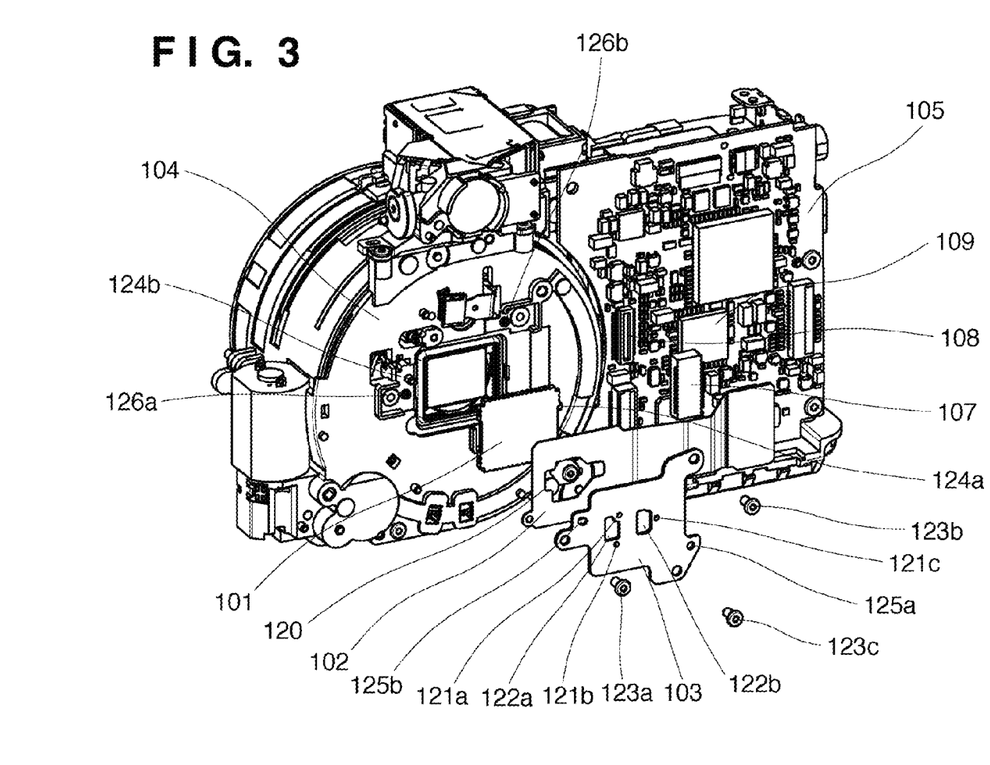
FIG. 3 is an exploded perspective view showing the arrangements of the image capturing unit and a main print circuit board according to the embodiment of the present invention.
Figure 4:
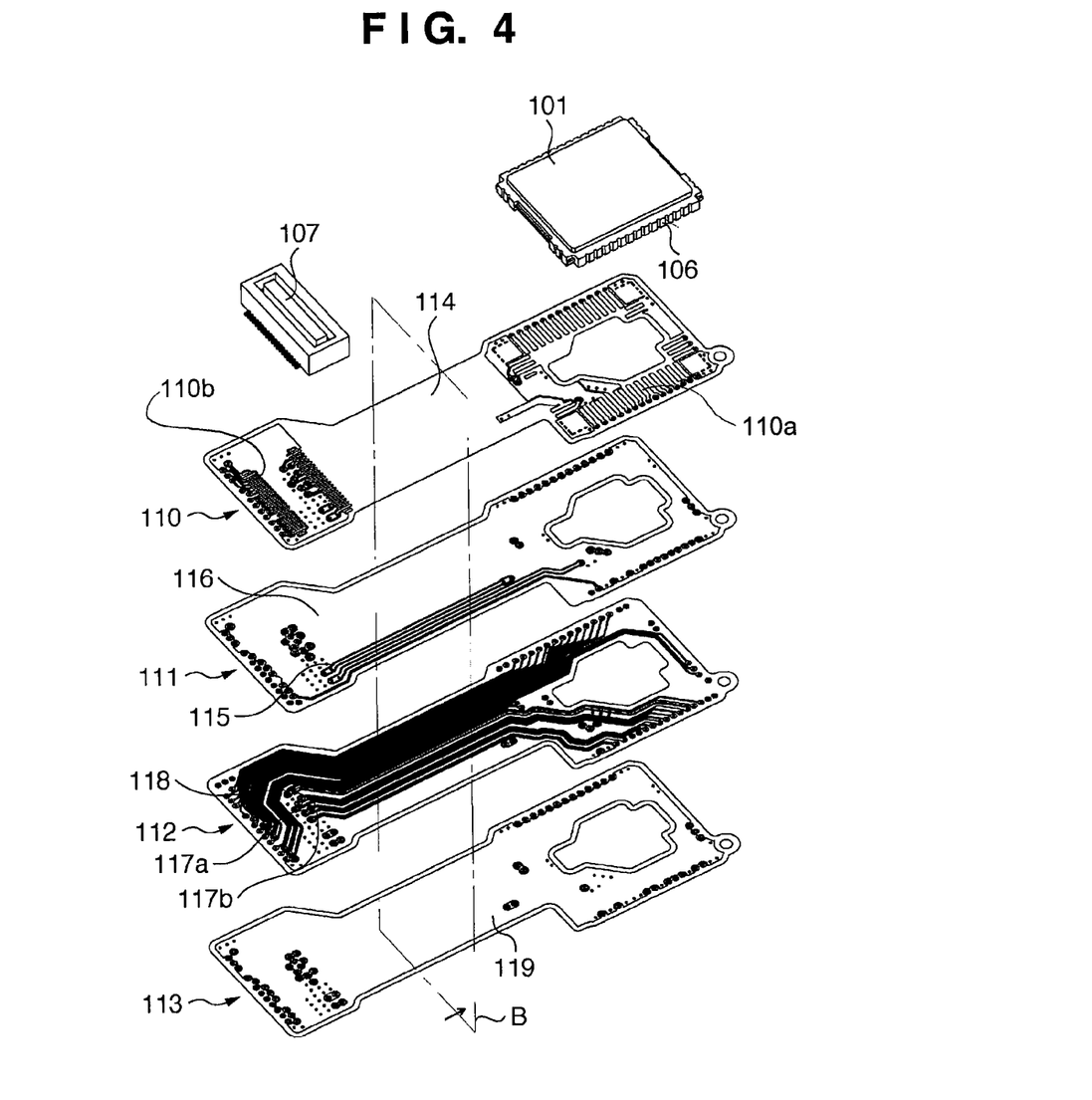
FIG. 4 is a view showing the interconnection layer arrangement and pattern wiring arrangement of a photoelectric conversion element print circuit board according to the embodiment of the present invention.
Figure 5:
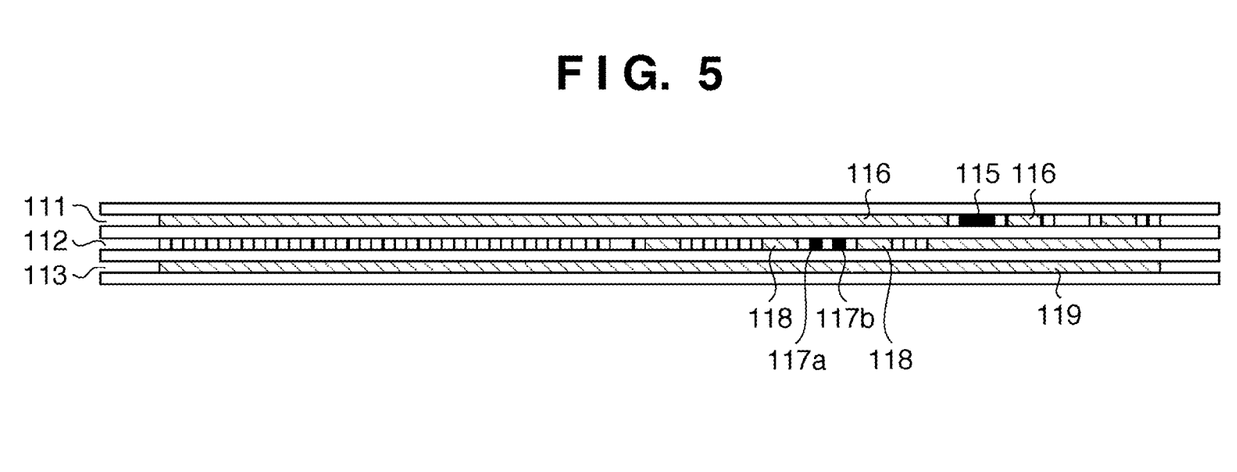
FIG. 5 is a schematic sectional view of plane B of the photoelectric conversion element print circuit board in FIG. 4 when viewed from a direction indicated by the arrow.
Figure 6A:
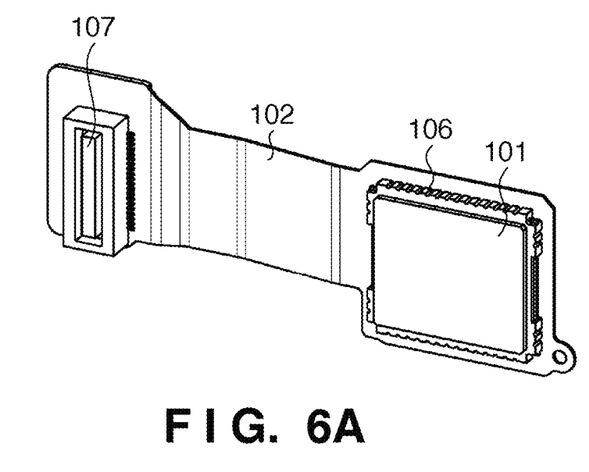
FIGS. 6A and 6B are perspective views of the mounting state of a photoelectric conversion element package and connector on the photoelectric conversion element print circuit board according to the embodiment of the present invention.
Figure 6B:
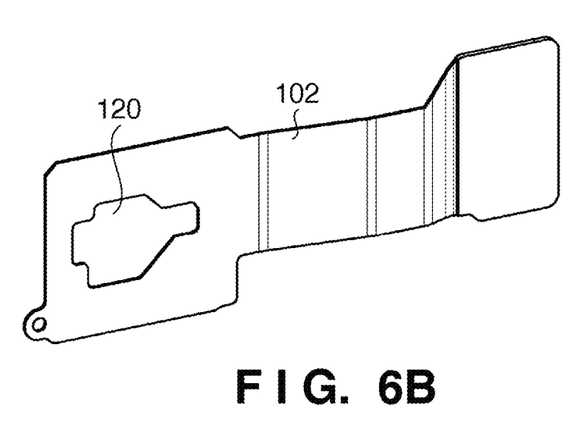
Figure 7A:
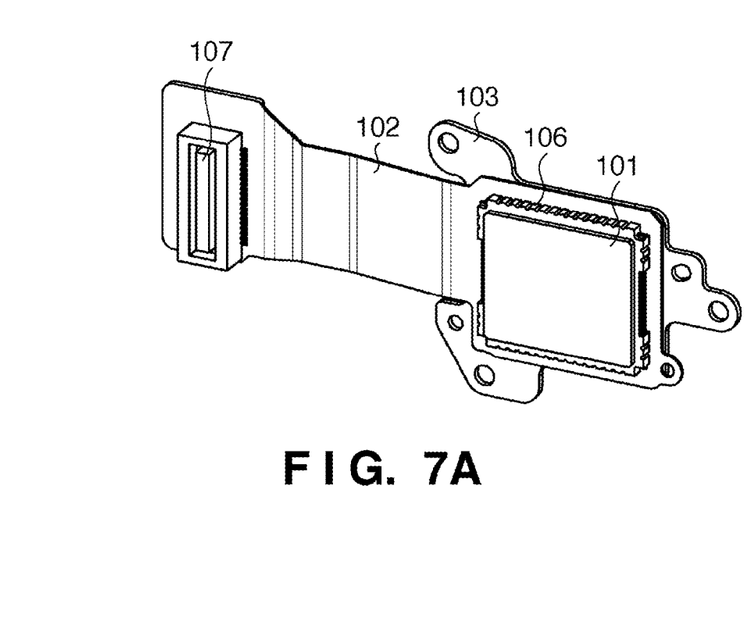
FIGS. 7A and 7B are perspective views of the fixed state of the photoelectric conversion element package and a position regulation member according to the embodiment of the present invention.
Figure 7B:
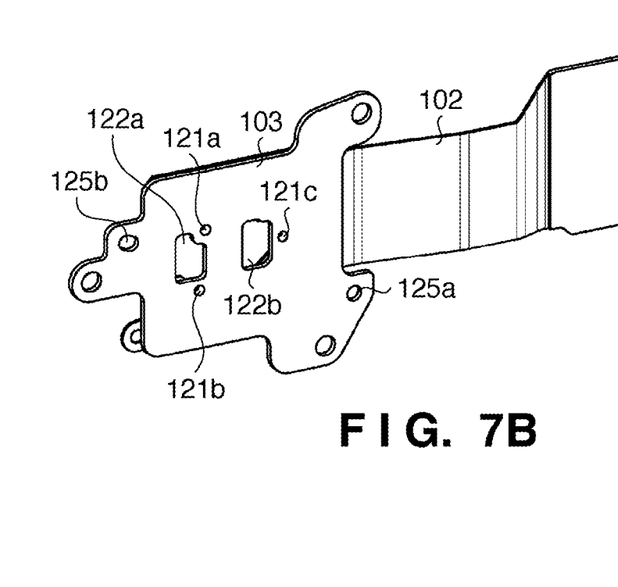
Figure 8:
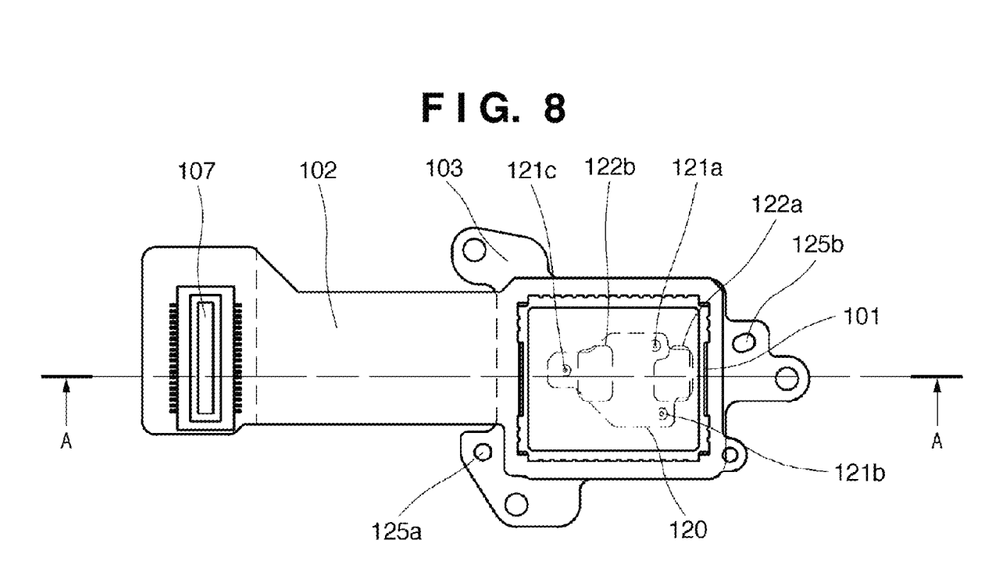
FIG. 8 is a perspective plan view of the same state as that in FIGS. 7A and 7B.
Figure 9:
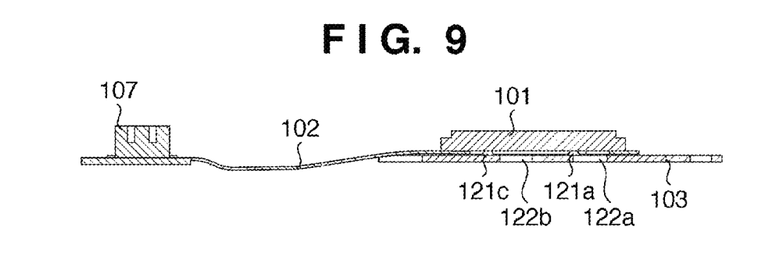
FIG. 9 is a sectional view taken along the line A-A in FIG. 8.
Figure 10:
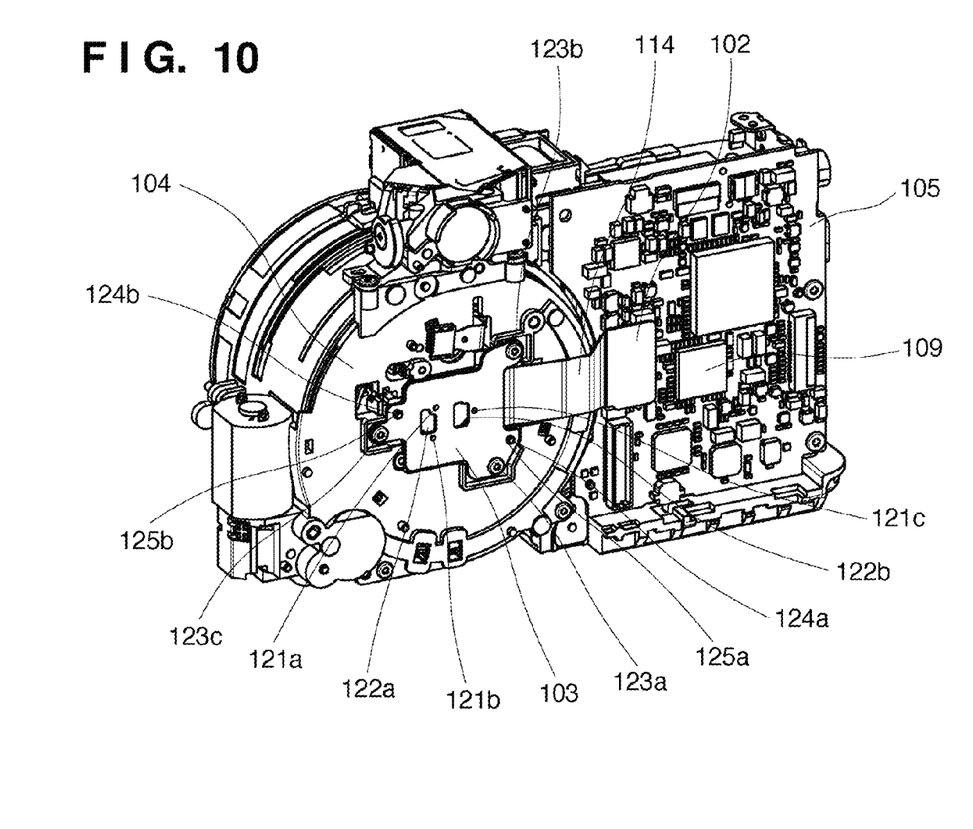
FIG. 10 is a perspective view of an assembly complete state showing the arrangements of the image capturing unit and main print circuit board according to the embodiment of the present invention.

FIG. 1 is an outer perspective view of a digital camera (electronic device) according to the embodiment of the present invention when viewed from the front. FIG. 2 is an outer perspective view showing the image capturing unit of the digital camera according to the embodiment. FIG. 3 is an exploded perspective view showing the arrangements of the image capturing unit and main print circuit board of the digital camera according to the embodiment. FIG. 4 is a view showing the interconnection layer arrangement and pattern wiring arrangement of a photoelectric conversion element print circuit board according to the embodiment of the present invention. FIG. 5 is a schematic sectional view of plane B of the photoelectric conversion element print circuit board in FIG. 4 when viewed from a direction indicated by the arrow. FIGS. 6A and 6B are perspective views of the mounting state of a photoelectric conversion element package and connector on the photoelectric conversion element print circuit board according to the embodiment of the present invention. FIGS. 7A and 7B are perspective views of the fixed state of the photoelectric conversion element package and a position regulation member according to the embodiment of the present invention. FIG. 8 is a perspective plan view of the same state as that in FIGS. 7A and 7B. FIG. 9 is a sectional view taken along the line A-A in FIG. 8. FIG. 10 is a perspective view of an assembly complete state showing the arrangements of the image capturing unit and main print circuit board according to the embodiment of the present invention.

In FIG. 1, reference numeral 1 denotes a digital camera (electronic device); and 2, an image capturing unit incorporated in the digital camera 1. As shown in FIG. 2, the image capturing unit 2 comprises an image sensing lens barrel 3, viewfinder unit 4, and AF auxiliary light unit 5. As shown in FIG. 1, each unit is exposed from an opening formed in the front sheath of the digital camera 1.

The arrangement of the image capturing unit 2 will be explained in detail. In FIG. 3, reference numeral 101 denotes a photoelectric conversion element package; 102, a photoelectric conversion element print circuit board; 103, a position regulation member; 104, an image sensing lens barrel unit; and 105, a main print circuit board.

The photoelectric conversion element package 101 contains a photoelectric conversion element, and has an electrode 106 on the side surface of the package.

The photoelectric conversion element package 101 is mounted on the photoelectric conversion element print circuit board 102. In addition to the photoelectric conversion element package 101, a connector 107 for connecting the main print circuit board 105 is mounted on the print circuit board 102.

A connector 108 for connecting the photoelectric conversion element print circuit board 102, and an IC 109 for driving the photoelectric conversion element and performing signal processing, are mounted on the main print circuit board 105.

An interconnection from the photoelectric conversion element package 101 to the connector 107 for connecting the main print circuit board 105 is formed on the photoelectric conversion element print circuit board 102. The connector 107 mounted on the photoelectric conversion element print circuit board 102 and the connector 108 mounted on the main print circuit board 105 are engaged with each other to electrically connect the photoelectric conversion element package 101 up to the IC 109.

The interconnection layer arrangement and pattern wiring arrangement of the photoelectric conversion element print circuit board 102 will be described in detail with reference to FIGS. 4 and 5. As shown in FIG. 4, the photoelectric conversion element print circuit board 102 is a multilayer flexible print circuit board obtained by laminating interconnection layers. In FIG. 4, reference numeral 110 denotes a first layer pattern (first layer); 111, a second layer pattern (second layer); 112, a third layer pattern (third layer); and 113, a fourth layer pattern (fourth layer). The respective interconnection layers can be connected to each other via through holes.

The first layer pattern 110 has a land 110a corresponding to the electrode 106 of the photoelectric conversion element package 101, a land 110b corresponding to the electrode of the connector 107, and patterns formed only around these lands. No pattern is formed at an intermediate portion 114 of the photoelectric conversion element print circuit board 102 that connects the mounting portions of the photoelectric conversion element package 101 and connector 107. A photoelectric conversion element signal output pattern 115 (analog signal pattern) is formed at the intermediate portion 114 on the second layer pattern 111, and surrounded with a ground pattern 116 (first ground pattern). The ground pattern 116 is wired to sandwich the photoelectric conversion element signal output pattern 115 on the second layer pattern 111 (on the second layer). The vertical register transfer clock pattern and horizontal register transfer clock pattern of the photoelectric conversion element are wired at the intermediate portion 114 on the third layer pattern 112. Of these patterns, high-speed driving pulse patterns 117a and 117b (digital signal patterns) are for the horizontal register transfer clock of the photoelectric conversion element. The high-speed driving pulse patterns 117a and 117b are surrounded at once with a ground pattern 118 (second ground pattern). The ground pattern 118 is wired to sandwich the high-speed driving pulse patterns 117a and 117b on the third layer pattern 112 (on the third layer). A ground solid pattern 119 (third ground pattern) is formed on the entire photoelectric conversion element print circuit board 102 on the fourth layer pattern 113. The ground solid pattern 119 is wired in at least an area where it covers a pattern wired on the third layer pattern 112.

Pattern arrangements at the intermediate portion 114 of the photoelectric conversion element print circuit board 102 will be explained with reference to FIG. 5. FIG. 5 is a schematic view of the section of the photoelectric conversion element print circuit board 102 on plane B in FIG. 4. As described above, the ground pattern 116 is formed on the two sides of the photoelectric conversion element signal output pattern 115 of the second layer pattern 111. The ground pattern 118 is formed on the two sides of the high-speed driving pulse patterns 117a and 117b of the third layer pattern 112. The photoelectric conversion element signal output pattern 115 and the high-speed driving pulse patterns 117a and 117b are wired while being staggered not to overlap each other. While the photoelectric conversion element signal output pattern 115 and the high-speed driving pulse patterns 117a and 117b are staggered and wired on different layers, a ground pattern is interposed between them. This structure can prevent crosstalk of the photoelectric conversion element signal output pattern 115 and the high-speed driving pulse patterns 117a and 117b.

The ground pattern 116 is formed at a portion of the second layer pattern 111 that overlaps the high-speed driving pulse patterns 117a and 117b. The ground solid pattern 119 is formed at a portion of the fourth layer pattern 113 that overlaps the high-speed driving pulse patterns 117a and 117b. Hence, the high-speed driving pulse patterns 117a and 117b are completely shielded with the ground patterns from the top, bottom, right, and left. By completely shielding the high-speed driving pulse patterns 117a and 117b from the top, bottom, right, and left with the ground patterns, unwanted radiation from the high-speed driving pulse patterns 117a and 117b can be reduced.

The intermediate portion 114 of the photoelectric conversion element print circuit board 102 between the mounting portion of the photoelectric conversion element package 101 and that of the connector 107 needs to have flexibility as high as possible in order to align the photoelectric conversion element and the image plane of the image sensing lens optical system. Four layers are wired at a component mounting portion of which high wiring density is required, whereas only three layers, that is, the second layer pattern 111, third layer pattern 112, and fourth layer pattern 113 are wired at the intermediate portion 114. Hence, the intermediate portion 114 has high flexibility because the number of copper foil layers for forming a pattern is smaller by one than that at the component mounting portion. Further, the intermediate portion 114 ensures higher flexibility by forming no insulating layer on the surface of the first layer pattern 110.

In the embodiment, the photoelectric conversion element print circuit board 102 is a multilayer flexible print circuit board having four interconnection layers. However, even a multilayer flexible print circuit board having a larger number of interconnection layers can obtain the same effects by forming the intermediate portion 114 in the above-described way.

Fixing of the photoelectric conversion element package 101, and the position regulation member 103 for regulating the position of the photoelectric conversion element package 101 will be described.

As shown in FIG. 6B, the photoelectric conversion element print circuit board 102 has an opening 120 at a portion corresponding to the inside of the electrode 106 of the mounted photoelectric conversion element package 101. While the photoelectric conversion element package is mounted, the lower surface of the photoelectric conversion element package 101 is exposed from the opening 120.

In this state, the photoelectric conversion element package 101 mounted on the photoelectric conversion element print circuit board 102 is fixed to the position regulation member 103, as shown in FIGS. 7A and 7B.

The position regulation member 103 is a metal plate. Projections 121a to 121c for regulating the position of the photoelectric conversion element package 101 along the optical axis of the image sensing lens barrel unit 104 are formed by half die cutting on the position regulation member 103. Openings 122a and 122b are formed near the projections 121a to 121c. The projections 121a to 121c are formed at positions where they abut against a portion of the lower surface of the photoelectric conversion element package 101 that is exposed from the opening 120 of the photoelectric conversion element print circuit board 102. The openings 122a and 122b are formed into a size at which they substantially fall within the opening 120 of the photoelectric conversion element print circuit board 102.

When fixing the photoelectric conversion element package 101 and position regulation member 103, the projections 121a to 121c abut against the lower surface of the photoelectric conversion element package 101. An adhesive is injected from the openings 122a and 122b into the gap between the photoelectric conversion element package 101 and the position regulation member 103, and then hardened, thereby fixing the photoelectric conversion element package 101 and position regulation member 103.

The adhesive injected into the gap between the photoelectric conversion element package 101 and the position regulation member 103 fills the space around and is fixed to the projections 121a to 121c which abut against the lower surface of the photoelectric conversion element package. As a result, the lower surface of the photoelectric conversion element package and the position regulation member 103 do not adhere to each other via air, but are firmly fixed.

At this time, the photoelectric conversion element package 101, photoelectric conversion element print circuit board 102, and position regulation member 103 have a positional relationship as shown in FIG. 8 when viewed from the top, and one as shown in FIG. 9 in the direction of thickness.

The projections 121a to 121c are formed at positions where they abut against a portion of the lower surface of the photoelectric conversion element package 101 that is exposed from the opening 120 of the photoelectric conversion element print circuit board 102. The projections 121a and 121c are arranged to maximize the intervals between them within the opening 120. The position of the photoelectric conversion element package 101 can, therefore, be regulated at high precision to minimize variations of the plane position of the photoelectric conversion element package 101 with respect to the position regulation member 103 against processing variations of the heights of the projections 121a to 121c.

The heights of the projections 121a to 121c formed on the position regulation member 103 are larger than the distance from the lower surface of the photoelectric conversion element package 101 mounted on the photoelectric conversion element print circuit board 102 to the lower surface of the photoelectric conversion element print circuit board 102. With this setting, the position regulation member 103 can directly regulate the position of the photoelectric conversion element package 101 along the optical axis while the photoelectric conversion element package 101 is mounted on the photoelectric conversion element print circuit board 102.

In addition, the heights of the projections 121a to 121c can be set at high precision to a value very close to the distance from the lower surface of the photoelectric conversion element package 101 mounted on the photoelectric conversion element print circuit board 102 to the lower surface of the photoelectric conversion element print circuit board 102. With this setting, the total thickness from the photoelectric conversion element package 101 to the position regulation member 103 can be minimized.

Finally, the integral unit of the photoelectric conversion element package 101, photoelectric conversion element print circuit board 102, and position regulation member 103 in the state of FIGS. 7A and 7B is attached to the image sensing lens barrel unit 104 with screws 123a to 123c, as shown in FIG. 10. Then, the connector 107 mounted on the photoelectric conversion element print circuit board 102 and the connector 108 mounted on the main print circuit board 105 are connected to each other. Accordingly, the photoelectric conversion element package 101 is electrically connected to the IC 109 which drives the photoelectric conversion element and performs signal processing.

As shown in FIG. 3, the image sensing lens barrel unit 104 has alignment projections 124a and 124b. The alignment projections 124a and 124b engage with alignment holes 125a and 125b to regulate the positions of the position regulation member 103 and photoelectric conversion element package 101 with respect to the image sensing lens barrel unit 104 in the plane direction perpendicular to the optical axis. At this time, biasing springs 126a to 126c (the biasing spring 126c is not shown) set at recesses formed in the image sensing lens barrel unit 104 bias the position regulation member 103 toward the heads of the screws 123a to 123c along the optical axis. By finely adjusting the degree of tightening the screws 123a to 123c, the position of the position regulation member 103 along the optical axis with respect to the image sensing lens barrel unit 104, and the angle with respect to the optical axis can be finely adjusted (plane tilt adjustment). The light receiving surface of the photoelectric conversion element package 101 can be aligned at high precision with respect to the image plane of the image sensing lens optical system of the image sensing lens barrel unit 104.

The photoelectric conversion element print circuit board 102 is bent at the intermediate portion 114 (bent portion) of the photoelectric conversion element print circuit board 102 between the mounting portion of the photoelectric conversion element package 101 and that of the connector 107. The plane tilt is adjusted by balancing the biasing force of the biasing springs 126a to 126c and the degree of tightening the screws 123a to 123c. In the embodiment, the intermediate portion 114 is sufficiently flexible, so the reaction force when bending the intermediate portion 114 does not influence plane tilt adjustment.

The above-described arrangement according to the embodiment can prevent crosstalk of the signal output pattern of the photoelectric conversion element and the driving pulse pattern without impairing the flexibility of the connecting portion between the photoelectric conversion element and the print circuit board on which the signal processing circuit is mounted. Since the driving pulse pattern is reliably shielded, unwanted radiation can be reduced. While the plane tilt of the photoelectric conversion element can be adjusted, a high-quality output from the photoelectric conversion element and reduction of unwanted radiation can be achieved.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-192906, filed on Jul. 25, 2007, which is hereby incorporated by reference herein in its entirety.

The invention claimed is:

1. A print circuit board which has a first mounting portion of an electrical component, a second mounting portion of a connector and a bending portion formed between the first mounting portion and the second mounting portion, the print circuit board comprising:
    a first layer in which a first land corresponding to an electrode pattern of the electrical component is formed on the first mounting portion and a second land corresponding to an electrode pattern of the connector is formed on the second mounting portion;
    a second layer which has a first wiring layer in which an analog signal pattern and a first ground pattern are formed on the bending portion and a first insulating layer stacked on the first wiring layer;
    a third layer which has a second wiring layer in which a digital signal pattern and second ground pattern are formed on the bending portion and a second insulating layer stacked on the second wiring layer;
    a fourth layer which has a third wiring layer in which a third ground pattern is formed on the bending portion and a third insulating layer stacked on the third wiring layer,
    wherein the first mounting portion and the second mounting portion consist of a four-layer structure in which the layers are stacked in the order of the fourth layer, the third layer, the second layer, and the first layer,
    wherein the bending portion consists of a seven-layer structure in which the layers are stacked in the order of a fourth insulating layer, the third wiring layer, the third insulating layer, the second wiring layer, the second insulating layer, the first wiring layer, and the first insulating layer, and
    wherein the digital signal pattern is sandwiched between the first ground pattern and the third ground pattern in stacking direction, and the analog signal pattern overlaps with the second ground pattern to prevent the analog signal pattern and the digital signal pattern from overlapping each other.

2. The flexible print circuit board according to claim 1, wherein the second ground pattern is arranged to sandwich the digital signal pattern in a direction perpendicular to the stacking direction.

3. The flexible print circuit board according to claim 1, wherein the first ground pattern is arranged to sandwich the analog signal pattern in a direction perpendicular to the stacking direction.

4. The flexible print circuit board according to claim 1, wherein the analog signal pattern transmits photoelectric conversion element signal and the digital signal pattern transmits driving pulse signal of transfer clock.

5. An electronic device comprising:
    a flexible print circuit board according to claim 1, wherein the electronic component is a photoelectric conversion element; and
    the photo electric conversion element.

* * * * *